US007120555B2

(12) United States Patent
Szajnowski

(10) Patent No.: US 7,120,555 B2
(45) Date of Patent: Oct. 10, 2006

(54) SIGNAL STATISTICS DETERMINATION

(75) Inventor: Wieslaw Jerzy Szajnowski, Guildford (GB)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 13 days.

(21) Appl. No.: 10/609,375

(22) Filed: Jul. 1, 2003

(65) Prior Publication Data

US 2004/0059517 A1 Mar. 25, 2004

(30) Foreign Application Priority Data

Jul. 1, 2002 (EP) ................................ 02254612

(51) Int. Cl.
*G01R 25/00* (2006.01)

(52) U.S. Cl. ...................... 702/179; 324/76.33; 327/14

(58) Field of Classification Search ................ 702/179; 375/130, 140, 353, 317; 327/67, 73, 87, 327/93–96, 100, 193, 527
See application file for complete search history.

(56) References Cited

U.S. PATENT DOCUMENTS

| | | | | |
|---|---|---|---|---|
| 3,732,405 | A | 5/1973 | Stewart | |
| 3,737,788 | A * | 6/1973 | Lenz | 327/14 |
| 3,896,395 | A * | 7/1975 | Cox | 330/53 |
| 4,122,393 | A * | 10/1978 | Gordy et al. | 375/343 |
| 4,387,465 | A * | 6/1983 | Becker | 375/130 |
| 4,638,185 | A * | 1/1987 | Kobayashi et al. | 327/93 |
| 4,843,309 | A * | 6/1989 | Kareem et al. | 324/121 R |
| 4,897,855 | A * | 1/1990 | Acampora | 375/245 |
| 5,272,725 | A * | 12/1993 | Jones et al. | 375/317 |
| 6,205,168 | B1 * | 3/2001 | Somayazulu | 375/149 |
| 6,249,556 | B1 * | 6/2001 | Rees et al. | 375/354 |
| 6,539,320 | B1 | 3/2003 | Szajnowski et al. | |
| 2003/0035549 | A1 * | 2/2003 | Bizjak et al. | 381/56 |
| 2004/0183531 | A1 * | 9/2004 | Robinson et al. | 324/253 |
| 2004/0185353 | A1 * | 9/2004 | Iriguchi | 430/22 |

OTHER PUBLICATIONS

IBM Technical Disclosure Bulletin, vol. 20, No. 11A, Apr. 1978, pp. 4280-4282.

* cited by examiner

*Primary Examiner*—Carol S. W. Tsai
(74) *Attorney, Agent, or Firm*—Birch, Stewart, Kolasch & Birch, LLP

(57) ABSTRACT

A signal can be analysed to determine statistical characteristics indicative of, for example, the predictability or time reversibility of the signal. The signal is examined to locate events corresponding to the crossing of predetermined levels with predetermined slopes. Multiple versions of the signal are combined, the versions being shifted with respect to each other by amounts corresponding to the spacings of the detected events. The shape of the resulting representation provides statistical information regarding the signal.

23 Claims, 9 Drawing Sheets

SIGNAL STATISTICS DETERMINATION

FIELD OF THE INVENTION

This invention relates to a method and apparatus for determining statistical characteristics of a signal, and is particularly but not exclusively applicable to characterisation of continuous-time random or chaotic or irregularly-behaved signals.

BACKGROUND OF THE INVENTION

There are many circumstances in which the statistical characteristics of a signal need to be analysed, for the purpose of, for example, classification of the signal, or monitoring or prediction of the signal behaviour. As will be described in further detail below, an example in which such determination is useful is that of random number generation, for example for use in cryptography. A random or chaotic noise signal can be applied to a digitiser which samples the signal at predetermined sampling intervals and outputs a digital representation of the signal which constitutes a random number. For efficiency, the sampling interval should be short. However, short sampling intervals may lead to random numbers which are not statistically independent of each other. It would therefore be desirable to analyse the statistical characteristics of the noise signal so as to enable the determination of the minimum sampling interval which is required to produce statistically independent random numbers.

There are many other circumstances in which signal statistics determination is useful. Where the signal represents variations in a physical parameter of a source, the statistical analysis can be used to classify the source. For example, each signal may represent variations within an image, and the statistical assessment can be used to classify the subject of the image. Similarly, statistical analysis could be used for classification of sound, such as speech or music.

Known analysis techniques include frequency-domain (or spectral) methods, and time-domain methods. Time-domain methods are often necessary in order to provide the required information, and are commonly based on autocorrelation of the signal.

Conventional correlation techniques are however based on the implicit assumption that the signal of interest is Gaussian, and that the statistical behaviour of the signal when considered in the forward direction of time corresponds to that in the backwards direction of time; any asymmetry in the behaviour is lost due to the fact that a correlation function is insensitive to the time direction. In practice, many of the signals being monitored are actually non-Gaussian. Non-linear dependencies in such signals may not be detected by standard correlation techniques.

It would therefore be desirable to provide a method and an apparatus for analysing the statistical behaviour of a signal, which provides a more useful result than the prior art techniques.

DESCRIPTION OF THE INVENTION

Aspects of the present invention are set out in the accompanying claims.

In accordance with a further aspect, a signal is examined to detect a plurality of events, each event corresponding to the signal adopting a predetermined slope when crossing a threshold level. (In a preferred embodiment, the signal is deemed to have a predetermined slope if the slope is, for example, positive as distinct from negative. Thus, each event occurs when the signal crosses the threshold as its level rises (i.e. at each "upcrossing") or when the signal crosses the threshold as its level is decreasing (i.e. each "downcrossing").)

Multiple versions (preferably identical copies) of the signal are derived from that single signal, and are shifted relative to each other such that each version contains an event which coincides with respective different events in the other versions. The multiple versions are then combined, for example by averaging (where the term "averaging" is intended herein to encompass summing).

The resulting function is a measure of the signal's average behaviour prior to and following the detected events. For convenience, this function will be referred to herein as the "crosslation function" and a device which is arranged to derive such a function will be referred to as a "crosslator". The function will be referred to as a "forward crosslation" function if the events upon which it is based are upcrossings, and a "backward crosslation" function if the events upon which it is based are downcrossings.

The shape of the crosslation function of a signal, which will be dependent upon the threshold level and the type of event upon which the crosslation function is based, will contain useful information regarding the input signal. At a given point relative to the origin (defined as the point at which the respective events are combined), the amplitude of the function will represent the bias of the input signal towards a particular value at a corresponding time relative to each event.

Furthermore, the relationship between the shapes of different crosslations (especially forward and backward crosslations) contains further useful information. It will be understood that downcrossings are, when the signal is reversed in time, equivalent to upcrossings. Therefore, a time reversible signal will exhibit symmetrical forward and backward crosslation functions for any given threshold level. Accordingly, the relationship between these functions will be an indicator as to the time reversibility of the input signal.

Furthermore, changes in the shape of one or more crosslation functions may also contain useful information regarding the nature of the input signal.

Accordingly, a device of the present invention preferably extracts one or more parameters dependent upon the shape of one or more crosslation functions to provide a value or series of values representative of statistical properties of the input signal.

For example, in an embodiment described below, the forward and backward crosslation functions are investigated to determine their amplitudes at points which correspond to the intervals between sampling pulses which are used to sample a random input signal for the purpose of random number generation. If the amplitudes depart significantly from the average value of the input signal, this suggests that sampling at this interval would result in a bias in successive sample values which would reduce their independence. Accordingly, the output of the analysis device can be used to indicate or correct this undesirable situation.

DESCRIPTION OF THE DRAWINGS

Arrangements embodying the present invention will now be described by way of example with reference to the accompanying drawings, in which.

DETAILED DESCRIPTION OF PREFERRED EMBODIMENTS

Figure 1:
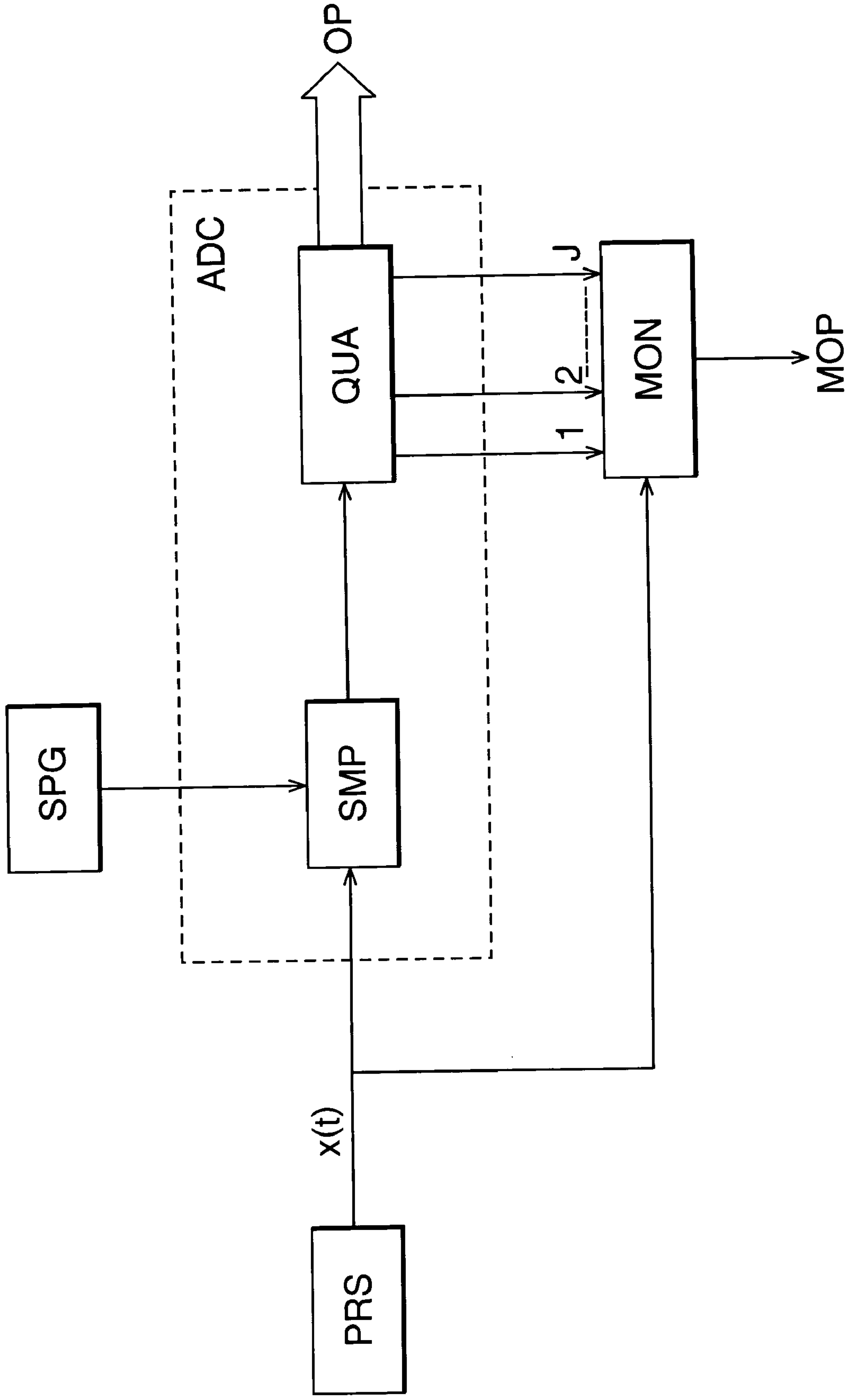
FIG. 1 depicts a random number generator incorporating a signal analysis device according to the present invention.

Referring to FIG. 1, this shows a random number generator which uses a signal analysis device in accordance with the present invention.

The random number generator comprises a physical random signal source (PRS) which generates a chaotic output signal x(t). A typical waveform of the signal x(t) is shown in each of FIGS. 2*a*) and 2*b*).

The signal x(t) is delivered to an analog-to-digital converter (ADC), which also receives sampling pulses from a sampling pulse generator (SPG). The chaotic signal x(t) is sampled by a sampler (SMP) at intervals corresponding to the period between sampling pulses, and each analog output is applied to an amplitude quantiser (QUA). The quantiser generates J different quantisation levels, against which the analog input sample is compared. At the output (OP) a digital number is produced in dependence upon the level of the analog sample.

Accordingly, the random number generator generates, at intervals corresponding to the period between sampling pulses, random numbers distributed within the range 0 to J.

The system described so far is known. In the embodiment of FIG. 1, a monitoring device (MON) is provided. This receives the chaotic signal x(t) and the quantisation levels 1 to J from the quantiser (QUA) and generates a monitor output (MOP) which indicates whether or not the random numbers can be expected to be statistically independent, as will be explained in further detail below.

Figure 7:
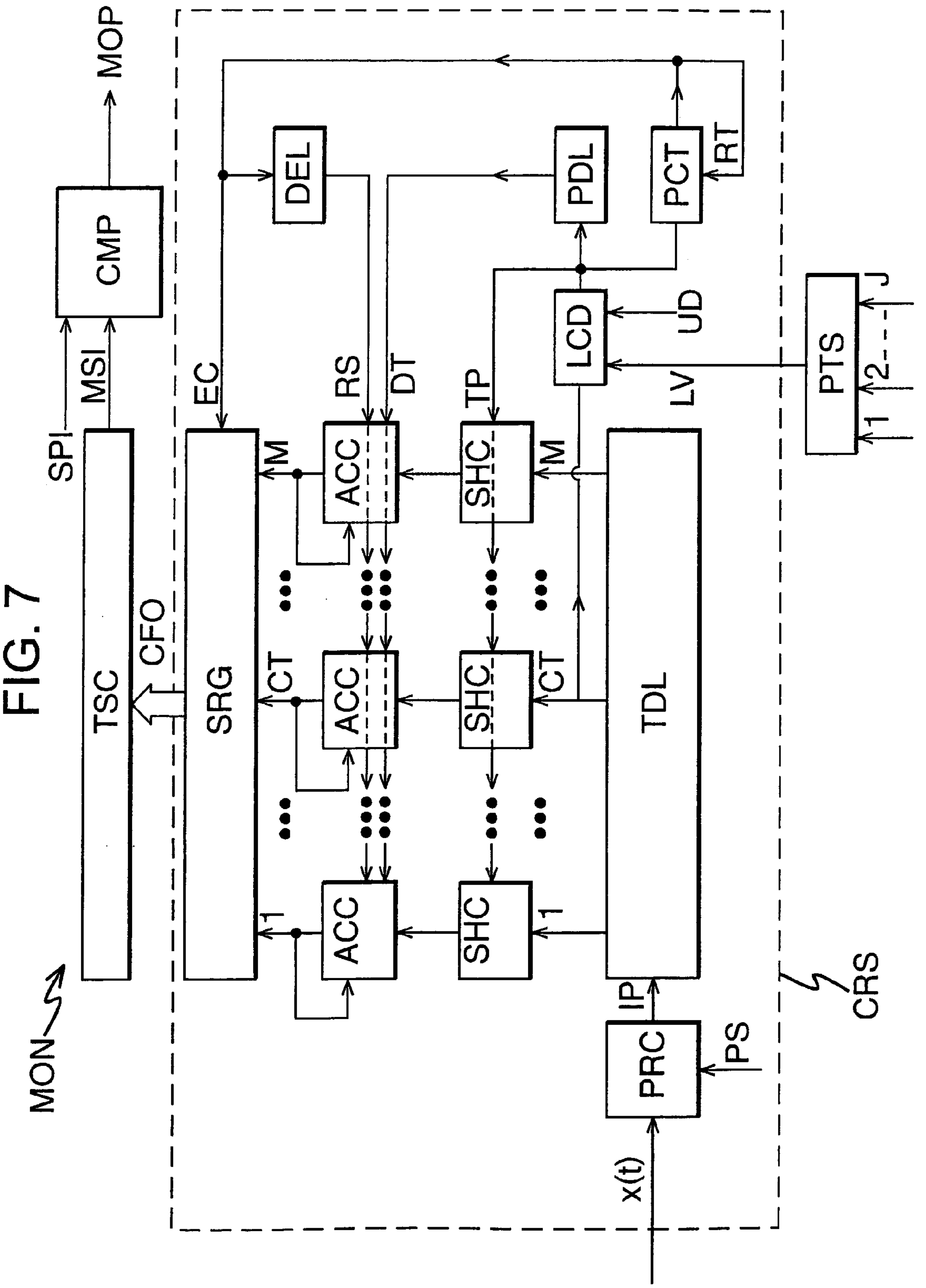
FIG. 7 is a block diagram of a monitoring unit of the generator of FIG. 1, the unit incorporating the signal analysis device.

The monitoring device (MON) is shown in FIG. 7, and comprises a signal analysis device (also referred to herein as a crosslator) (CRS) in accordance with the present invention. This receives the signal x(t) and also successively receives each of the quantisation level signals 1 to J via a parallel to serial converter (PTS). The crosslator (CRS) outputs a crosslation function (as explained below) at an output (CFO) to a time shift comparator (TSC). The time shift comparator (TSC) derives a signal MSI, which represents the minimum sampling interval required to obtain statistically independent samples. A comparator (CMP) compares this value with a value SPI representing the current sampling pulse interval. The comparator generates the monitor output (MOP), which indicates whether or not the current sampling pulse interval exceeds the calculated minimum sampling interval, as it should for correct operation.

The principal of operation of the crosslator (CRS) will be described with reference to FIGS. 2 to 6.

Figures 2A, 2B:
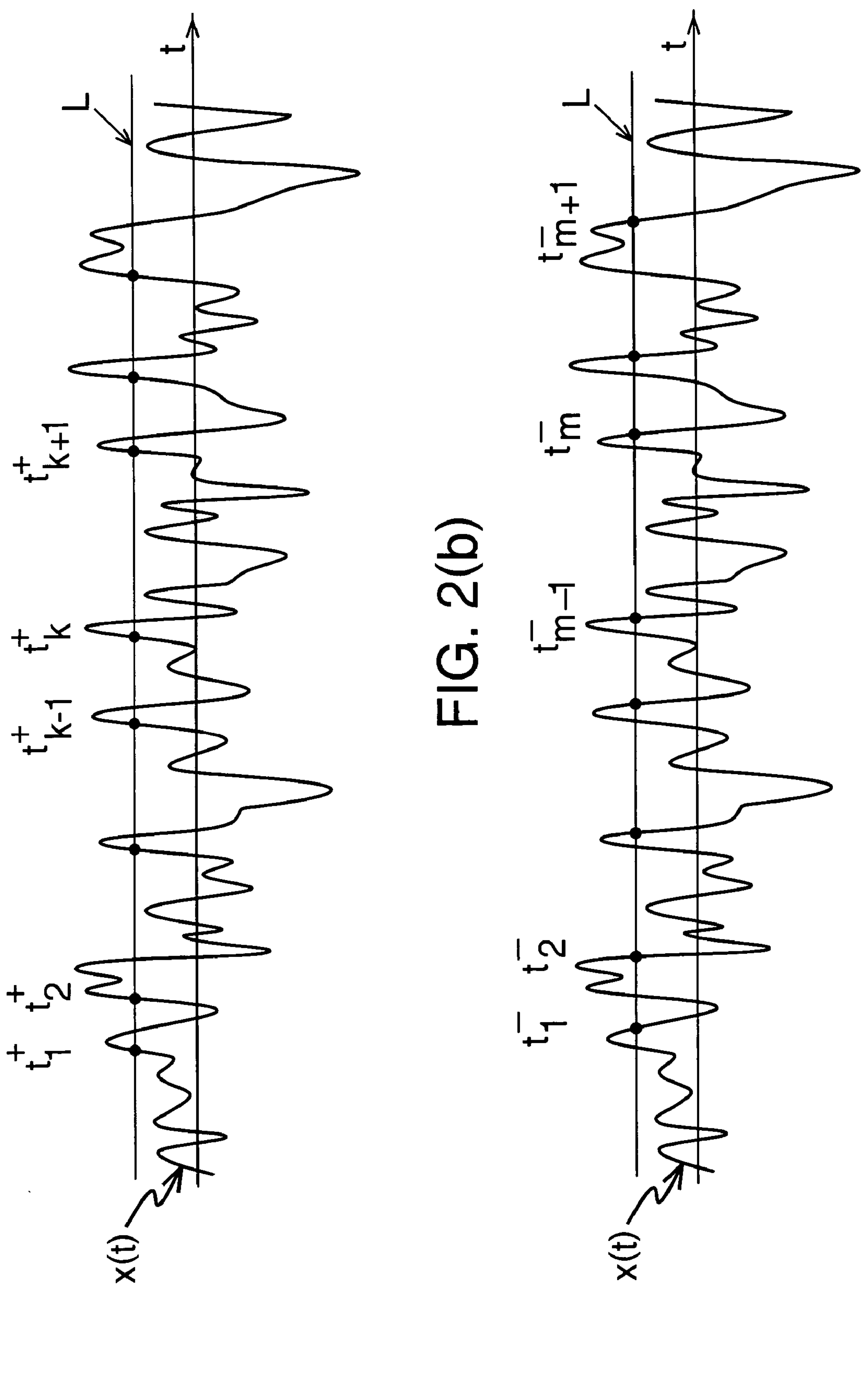
FIGS. 2*a*) and 2*b*) show a chaotic signal x(t) used by the generator of FIG. 1.

Referring to FIG. 2*a*), this shows the signal x(t), which represents a random, chaotic or other irregular process continuous in time, and a constant level (threshold) of value L. There are time instants at which the signal x(t) crosses the level L with a positive slope. The resulting time instants $$t^{+}_{1}, t^{+}_{2}, \ldots, t^{+}_{k-1}, t^{+}_{k}, t^{+}_{k+1}, \ldots$$

form a set of upcrossings of level L; those upcrossings are marked with dots in FIG. 2*a*).

Figure 3:
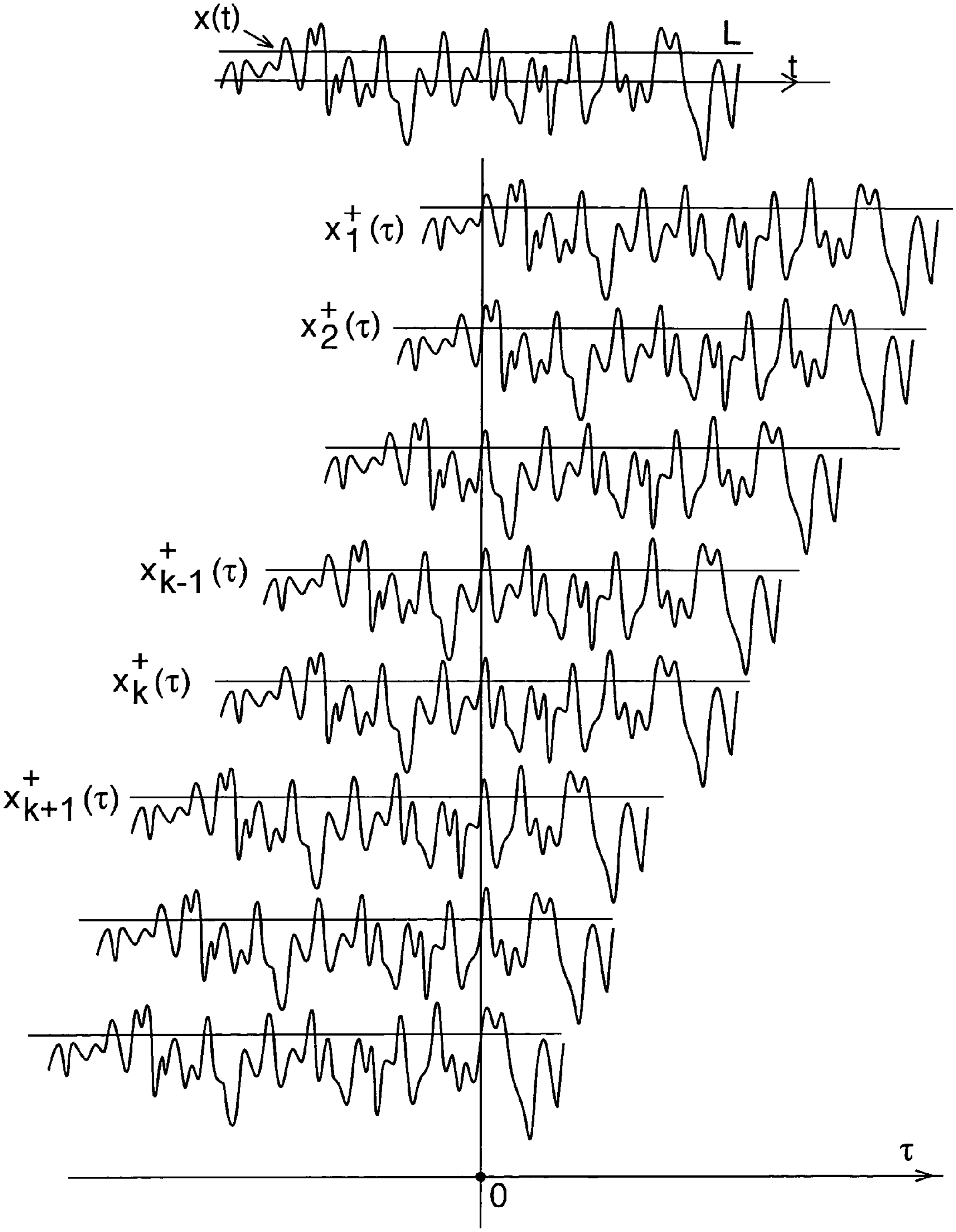
FIG. 3 depicts a segment of the chaotic signal x(t) and a plurality of trajectories associated with all upcrossings of a level observed within the signal segment.

Select any one of those upcrossings, say that at $t^{+}_{k}$, and consider the signal x(t) before and after the time instant $t^{+}_{k}$. A signal trajectory $x^{+}_{k}(\tau)$ associated with the upcrossing at $t^{+}_{k}$ is defined by $$x^{+}_{k}(\tau)=x(t^{+}_{k}+\tau)$$

where $\tau$ is the relative time. Therefore, the selected trajectory $x^{+}_{k}(\tau)$, shown in FIG. 3, is simply a time-shifted copy of the signal x(t) under examination. Irrespective of the time origin, t=0, of the underlying signal x(t), the trajectory $x^{+}_{k}(\tau)$, being a function of the relative time $\tau$, will always contain the origin $\tau=0$.

In accordance with the above construction, each upcrossing of level L defines a corresponding time-shifted copy of the underlying signal x(t). FIG. 3 depicts, separately and sequentially, trajectories which are generated by all upcrossings of level L in the illustrated signal segment x(t). All upcrossings coincide, in that they jointly define and share the same origin $\tau=0$ of the relative time $\tau$.

Figure 4:
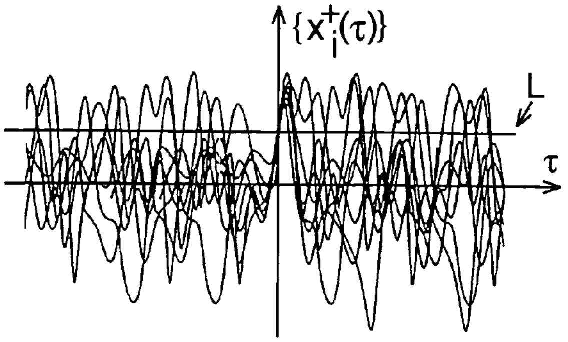
FIG. 4 depicts the trajectories of FIG. 3 when superimposed.

The trajectories of FIG. 3 are also shown superimposed in FIG. 4 as functions of the relative time $\tau$.

Figure 5:
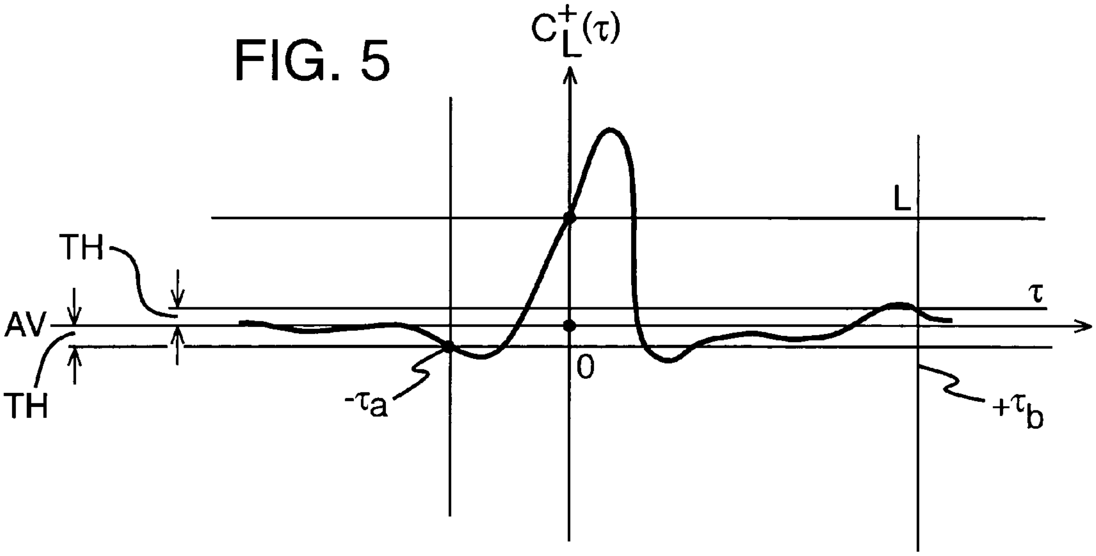
FIG. 5 shows an empirical forward crosslation function $C^{+}_{L}(\tau)$ of the chaotic signal x(t) obtained by averaging the trajectories in FIG. 4.

The trajectories $\{x^{+}_{i}(\tau), i=1, 2, \ldots, k-1, k, k+1, \ldots\}$, associated with the corresponding upcrossings at $\{t^{+}_{i}, i=1, 2, \ldots, k-1, k, k+1, \ldots\}$, can be averaged to derive a function $C^{+}_{L}(\tau)$, referred to herein as the forward crosslation (FC) function. For illustrative purposes, FIG. 5 depicts an empirical forward crosslation function $C^{+}_{L}(\tau)$ obtained by averaging the trajectories shown in FIG. 4. The function characterises the average behaviour of signal x(t) conditioned on upcrossings of level L, and will depend on the relative time $\tau$. In particular, the value at $\tau=0$ is, by construction, simply equal to L, as can be deduced from FIG. 4. For large values of $\tau$, $C^{+}_{L}(\tau)$ tends to the mean AV of the underlying primary process x(t), because the dependence on the upcrossing vanishes.

In a similar manner, the time instants are determined at which the signal x(t) crosses the level L with a negative slope. The resulting time instants $$t^{-}_{1}, t^{-}_{2}, \ldots, t^{-}_{m-1}, t^{-}_{m}, t^{-}_{m+1}, \ldots$$

shown in FIG. 2*b*), form a set of downcrossings of level L.

Figure 6:
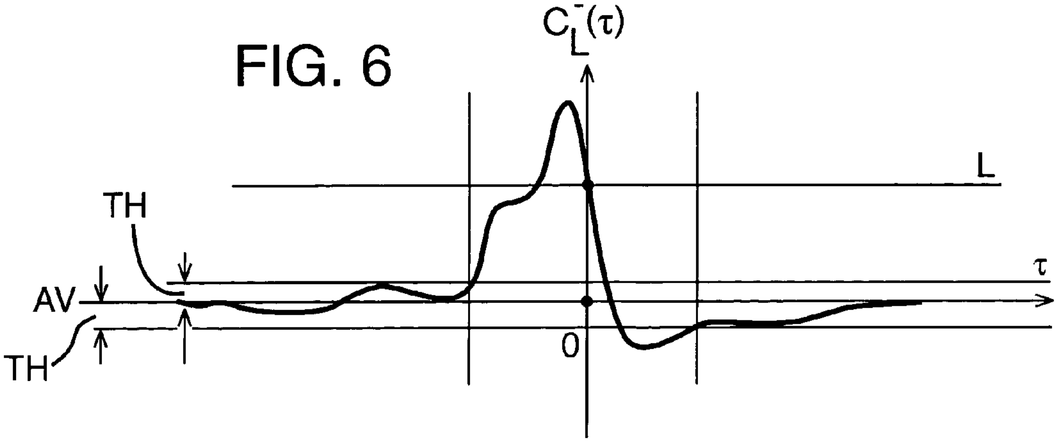
FIG. 6 depicts an empirical backward crosslation function $C^{-}_{L}(\tau)$ of the chaotic signal x(t)

By a process analagous to that described with reference to FIGS. 3 to 5, it is possible to derive a function $C^{-}_{L}(\tau)$, shown in FIG. 6, which corresponds to the forward crosslation function $C^{+}_{L}(\tau)$ except that it is based on downcrossings, rather than upcrossings. The function therefore represents the average behaviour of x(t) conditioned on downcrossing of level L.

It should be noted that the downcrossings of level L by a signal x(t) coincide with the upcrossings of level L by a time-reversed replica x(−t) of the underlying signal x(t). Therefore, the crosslation function $C^{-}_{L}(\tau)$ based on downcrossings will be referred to as the backward crosslation (BC) function. Also in this case, $C^{-}_{L}(0)=L$, and $C^{-}_{L}(|\tau|)$ approaches the mean value AV for large values of τ.

When the forward and backward crosslation functions are determined for unipolar signals assuming only positive values, the threshold level L is always positive. However, in the case of bipolar signals, several approaches are possible:

1. only non-negative (or non-positive) threshold levels are used;

2. positive and negative (including zero) threshold levels can be used for signal processing;

3. only non-negative (or non-positive) threshold levels are used, but both the original signal and its reversed-polarity replica are processed.

The forward crosslation (FC) function and the backward crosslation (BC) function provide a useful characterization of the process under investigation. For example, for positive values of the relative time τ, the forward crosslation (FC) function facilitates the prediction of future values of a process given that the process has crossed at some time instant a predetermined level with a positive slope. For negative values of τ, the forward crosslation (FC) function describes the average behaviour of the process prior to the upcrossing time instant.

In a similar manner, the backward crosslation (BC) function facilitates the prediction of future values of a process given that the process has crossed a predetermined level with a negative slope. For negative values of the relative time τ, the backward crosslation (BC) function describes the average behaviour of the process prior to the downcrossing time instant.

When a process is examined in reversed time, the roles of the forward crosslation (FC) function and the backward crosslation (BC) function are interchanged. Consequently, for time-reversible processes, the forward crosslation (FC) function and the backward crosslation (BC) function are mirror images of one another. Thus, the forward crosslation (FC) and backward crosslation (BC) functions can be exploited for testing time reversibility of processes of interest.

According to an embodiment of the present invention, the forward crosslation (FC) function and/or the backward crosslation (BC) function can be derived using the crosslator (CRS) shown in FIG. 7. It is to be noted that the crosslator (CRS) forming part of the monitor (MON) of FIG. 7, and the modified crosslators to be described below, may be formed as general-purpose devices, possibly constructed on a separate integrated circuit, for use in a variety of different applications. Some of the functionality provided by the crosslators may not be required in certain applications, and indeed not all the functions to be described below are necessary for use in the monitor (MON) of FIG. 7.

The crosslator (CRS) comprises a polarity-reversal circuit (PRC), an analogue delay line (TDL) with multiple taps, a level crossing detector (LCD), two pulse delay circuits (PDL and DEL), a pulse counter (PCT), a plurality of sample-and-hold circuits (SHC), a plurality of accumulators (ACC) and a storage register (SRG). The storage register (SRG) may also incorporate a suitable waveform interpolator.

The polarity (positive or negative) of a time-varying input signal x(t) is set by an appropriate value held at a binary polarity-select input (PS) of the polarity-reverse circuit (PRC). The signal with selected polarity is then applied to an input (IP) of the delay line (TDL). In the shown configuration, each of M taps of the delay line (TDL) provides a time-delayed replica of the signal appearing at the input (IP). At any time instant, the signal samples observed at the M taps of the delay line (TDL) form jointly a discrete-time representation of a finite segment of the signal propagating along the delay line (TDL). Preferably, the relative delay between consecutive taps of the delay line (TDL) has a constant value.

Each of the M taps of the delay line (TDL) is connected to a respective sample-and-hold circuit (SHC), and a selected tap (CT), preferably the center tap, is also connected to the level crossing detector (LCD).

The level crossing detector (LCD) detects either upcrossings or downcrossings, depending on the value held at a binary selector input (UD). The desired crossing level L is set by applying a suitable threshold value to a threshold input (LV) of the level crossing detector (LCD). When the forward crosslation (FC) function is to be determined, the level crossing detector (LCD) operates as a detector of upcrossings. Similarly, when the backward crosslation (BC) function is to be determined, the level crossing detector (LCD) detects downcrossings.

When the forward crosslation (FC) function is being determined, each time an upcrossing of a prescribed level L is detected at center tap (CT) by the level crossing detector (LCD), a short trigger pulse (TP) is generated at the level crossing detector (LCD) output. The trigger pulse (TP) initiates, via a common trigger pulse (TP) input, the simultaneous operation of all sample-and-hold circuits (SHC). Each sample-and-hold circuit (SHC) captures the instantaneous value of the signal appearing at its input and supplies this value to a respective accumulator (ACC).

The trigger pulse (TP) also increments by one the current state of the pulse counter (PCT). The capacity of the pulse counter (PCT) is equal to a predetermined number N of level crossings (i.e. the number N of signal trajectories being processed). The trigger pulse (TP) is also applied to a suitable pulse delay circuit (PDL) whose delay is preferably equal to the settling time of the sample-and-hold circuits (SHC).

A delayed trigger pulse obtained from the pulse delay circuit PDL initiates, via a common accumulator input (DT), the simultaneous operation of all accumulators (ACC) driven by respective sample-and-hold circuits (SHC). The function of each accumulator (ACC) is to perform addition or averaging of all N samples appearing successively at its input during one full operation cycle of the crosslator (CRS).

When a predetermined number N of level crossings has been detected by the level crossing detector (LCD), and registered by the pulse counter (PCT), an end-of-cycle (EC) pulse is produced at the output of the pulse counter (PCT). The end-of-cycle (EC) pulse resets the pulse counter (PCT), via a reset input (RT) thereof, and it also initiates the transfer of the accumulators' contents to the storage register (SRG). Each end-of-cycle (EC) pulse, suitably delayed by the pulse delay circuit (DEL), sets all the accumulators (ACC) to their initial zero state via a common input reset (RS). Shortly after the occurrence of the end-of-cycle (EC) pulse, a discrete-time version of the determined forward crosslation (FC) function is available at the output (CFO) of the storage register (SRG).

When no waveform interpolation is used in the storage register (SRG), the determined forward crosslation (FC) function is represented by M values. However, some additional signal processing may be performed in the storage register (SRG) to produce an interpolated (smoothed) representation of the forward crosslation (FC) function comprising more than M primary values supplied by the accumulators (ACC).

Figure 8:
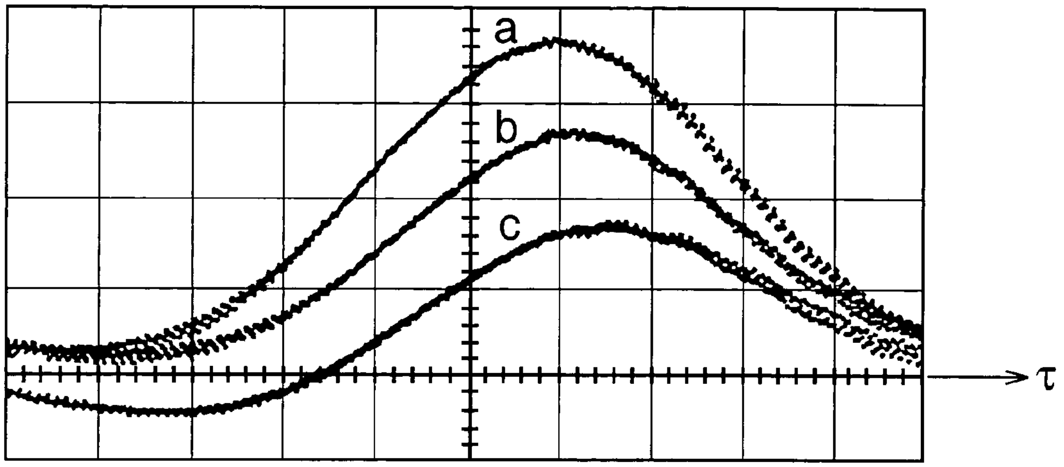
FIG. 8 depicts the shapes of the empirical forward crosslation function $C^{+}_{L}(\tau)$ obtained experimentally for three different crossing levels L: (a) $L=3\sigma$; (b) $L=2\sigma$; (c) $L=\sigma$, where $\sigma$ is the rms value of the signal under investigation.

FIG. 8 shows the shapes of the empirical forward crosslation (FC) function determined experimentally for three different values of upcrossing level L: L=σ, L=2σ and L=3σ, where σ is the rms value of the processed signal. In this case, the signal x(t) processed by the crosslator was generated by a physical noise source.

When the backward crosslation (BC) function is being determined, each time a downcrossing of level L is detected at tap (CT) by the level crossing detector (LCD), a short trigger pulse (TP) is generated at the level crossing detector (LCD) output. The remaining functions and operations are identical to those performed by the crosslator in the case of determining the forward crosslation (FC) function.

When fast-varying signals are to be processed, the delay introduced by the level crossing detector (LCD) may be excessive and should be compensated. The delay compensation can for example be accomplished by employing one of the following two approaches:

1. The level crossing detector (LCD) is driven by a tap preceding center the tap (CT), and such obtained pre-trigger pulse is additionally delayed at the level crossing detector (LCD) output by an auxiliary circuit, so that the total delay introduced (by the level crossing detector (LCD) and the circuit) matches the relative delay between the two taps.

2. A dedicated pre-trigger tap is provided by the delay time (TDL), the pre-trigger tap preceding the center tap (CT), and the relative delay between the two taps matching that of the level crossing detector (LCD).

The operation has been described above in the assumption that the input signal x(t) is unipolar. However, the crosslator (CSR) is also operable to handle bipolar signals and to derive respective functions based on both positive and negative threshold crossings. In order to achieve this, whenever a function based on a negative threshold is being derived, the polarity-reverse circuit (PRC) is caused by the signal at polarity-select input (PS) to reverse the polarity of the input signal x(t) so that the level crossing detector (LCD) can use a corresponding positive crossing level for deriving the required function.

The operation of the monitor (MON) of FIG. 7 will now be described.

Initially, the parallel to serial converter (PTS) is arranged to transfer the value of quantisation level 1 to the threshold input (LV) of the level crossing detector (LCD). The signal input (UD) of the level crossing detector is set such that the crosslator produces at its output (CFO) the forward crosslation function.

Referring to FIG. 5, it is assumed that the crosslation function has a significant value if the modulus of the difference between its value and the average value AV of the input function x(t) is greater than a threshold TH. Accordingly, the value is significant within the range $-\tau_a$ to $+\tau_b$.

If the sampling interval is less than $|\tau_b|$, then there is a danger than successive random values will have a bias depending upon their preceding values, because significant forward crosslation function levels for positive values of τ represent the forward predictability of the function. Correspondingly, if the sampling level is less than $|\tau_a|$, then preceding random numbers have a bias associated with their succeeding values, i.e. there is a risk of backwards predictability, i.e. that a preceding value can be determined from later values. In random number generation it may be important to avoid this so as to prevent prediction of a random number "seed value".

Accordingly, it would be desirable to ensure that the minimum sampling interval is greater than the largest of $|\tau_a|$ and $|\tau_b|$. The time-shift comparator (TSC) examines the crosslation function to determine the maximum value of $|\tau|$ at which there is a significant difference between the crosslation function and the average value AV of the input signal x(t).

The input (UD) is then switched so that the crosslator produces the backward crosslation function at its output, and the time-shift comparator again operates to find the maximum value $|\tau|$ where the crosslator output is significant.

Then, the parallel to serial converter (PTS) is operated to transfer the second quantisation level to the level crossing detector (LCD) and the crosslator operations are repeated so as to obtain the forward and backward crosslation functions. This sequence is carried out for each of the quantisation levels 1 to J.

Accordingly, the time-shift comparator (TSC) calculates multiple values, $\tau_{ij}$, for both the forward and backward crosslation functions for all the quantisation levels 1 to J, wherein i=0 (for forward crosslation) or 1 (for backward crosslation) and j=1 to J, each value $\tau_{ij}$ representing the maximum value $|\tau|$ at which the respective crosslator function is significantly different from the average value AV.

The minimum sample interval MSI is then calculated as:

MIS=the maximum value of $\tau_{ij}$, for i=0, 1 and j=1 to J.

Figure 9:
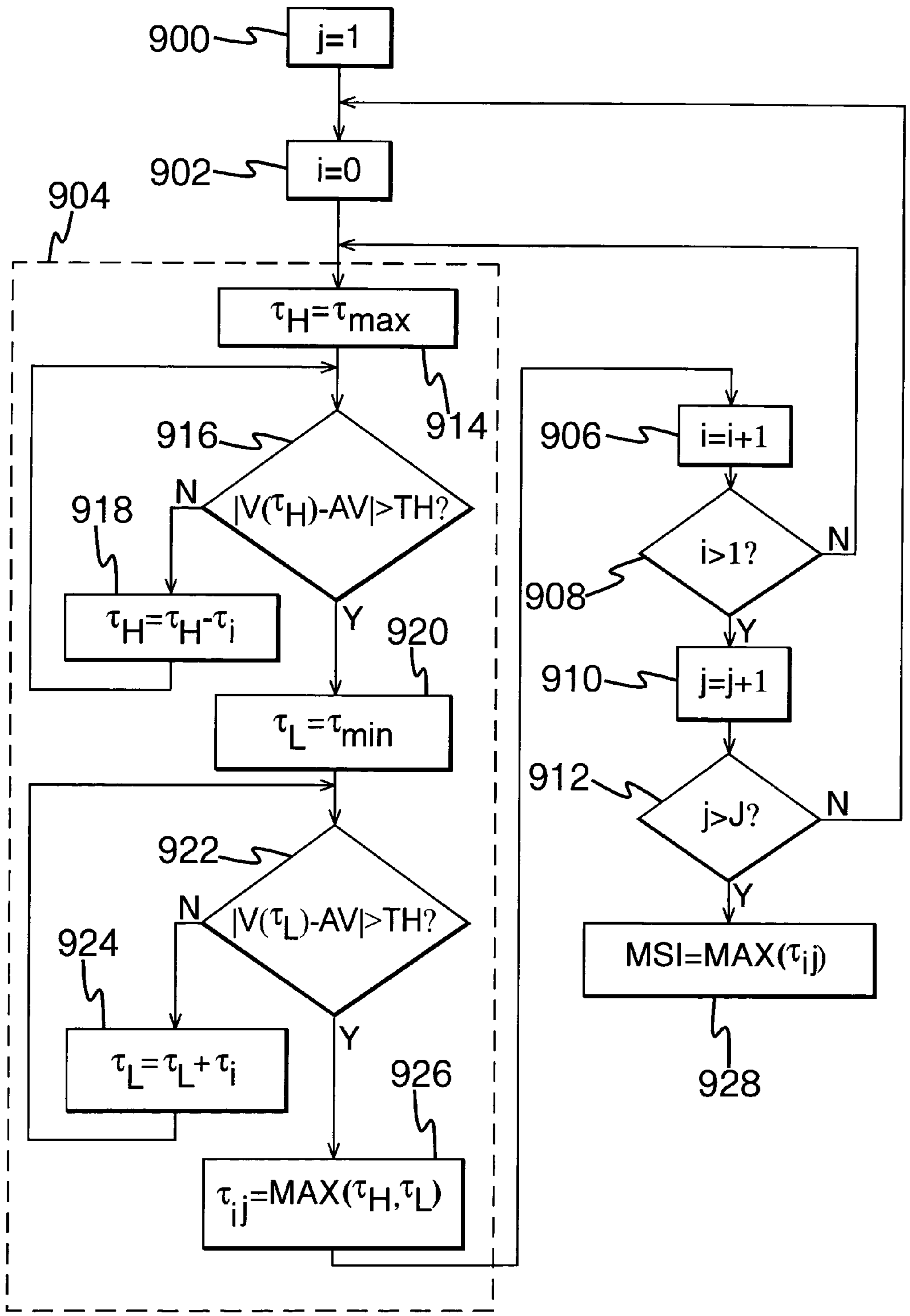
FIG. 9 is a flowchart of the operation of a time-shift comparator of the unit of FIG. 7.

This operation is shown in more detail in the flowchart of FIG. 9. The first quantisation level (j=1) is selected at step 900, and forward crosslation (i=0) is selected at step 902. The procedure shown in a block 904 is intended to derive the value $\tau_{ij}$. At step 906, i is incremented (to select backward crosslation), and at step 908 i is checked to see whether it has yet exceeded 1. If not, the procedure 904 is repeated in order to derive the value $\tau_{ij}$ for backward crosslation.

The value i is again incremented at step 906, and, this time, step 908 detects that i has exceeded 1, so the program proceeds to step 910. Here, the value j is incremented so as to select the next quantisation level. At step 912 the program determines that the final quantisation value J has not yet been exceeded, and therefore the steps 902 to 910 are repeated. Thus, the values $\tau_{ij}$ are calculated during procedure 904 for all values for j and for both forward and backward crosslation functions.

The procedure 904 involves initially setting a variable $\tau_H$ equal to the maximum possible value of τ, $\tau_{max}$ at step 914.

At step 916, the program determines the difference between the value of the crosslation function at this point $\tau_H$, i.e. $V(\tau_H)$, minus the mean value AV of the input signal x(t). The program then determines whether the modulus of this difference is greater than the predetermined threshold TH. Because the program starts by looking at the highest value of τ, $\tau_{max}$, the crosslation function will be approximately equal to the mean level AV, so the program would then proceed to step 918. At this point, the value of $\tau_H$ is decreased by an incremental quantity $\tau_i$ (representing the delay between successive stages of the delay line (DTL)). Step 916 is repeated.

Thus, the program examines the crosslation functions, starting at the highest value $\tau_{max}$, until step 916 detects that the crosslation functions steps outside the threshold TH. At this point, the program proceeds to step 920.

At step 920, the program sets another variable $\tau_L$, equal to the minimum possible value of $\tau$, $\tau_{min}$. The program then proceeds to step 922. Here, the program determines whether the difference between the correlation function for the current value $\tau_L$ and the average value AV exceeds the threshold TH. If not, the program proceeds to step 924 where $\tau_L$ is increased by the incremental value $\tau_i$. The program then returns to step 922. This continues, with the program successively checking the crosslation function for increasing values of $\tau$ until the value falls outside the threshold region. The program then proceeds to step 926.

At step 926, the program sets the value $\tau_{ij}$ equal to the maximum of $\tau_H$ and $\tau_L$ and stores the value $\tau_{ij}$ for later use.

At the end of the procedure shown in FIG. 9, the program proceeds from step 912 to step 928, where the minimum sampling interval MIS is set equal to the maximum value of all the stored $\tau_{ij}$ values.

This value is sent to the comparator (CMP) which compares the value with the value SPI representing the actual sampling interval. If the actual sampling interval is greater than MSI, then the comparator output (MSP) indicates that successive random numbers are expected to be statistically independent. If desired, the comparator output can be used to control the sampling interval, i.e. to increase it if the current sampling interval is determined to be smaller than MSI.

While the forward crosslation (FC) function and the backward crosslation (BC) function provide a useful characterization of a process under investigation, in practical applications certain combinations, such as the sum or the difference, of the forward crosslation (FC) and backward crosslation (BC) functions may prove more informative.

Figure 10:
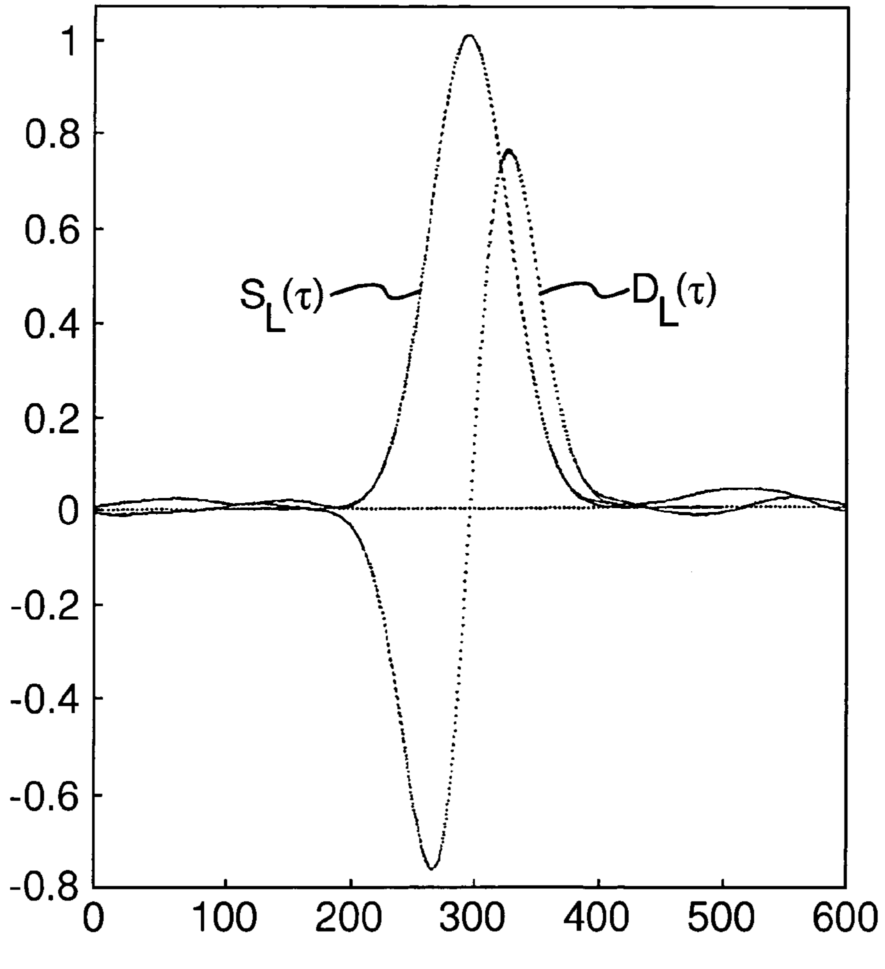
FIG. 10 depicts the shapes of a crosslation sum function $S_L(\tau)$ and a crosslation difference function $D_L(\tau)$.

The sum $S_L(\tau)$ of the forward crosslation (FC) function $C^+_L(\tau)$ and the backward crosslation (BC) function $C^-_L(\tau)$, $$S_L(\tau)=C^+_L(\tau)+C^-_L(\tau)$$

is referred to as the crosslation sum (CS) function, and a typical example is shown in FIG. 10. The crosslation sum (CS) function $S_L(\tau)$ provides information somewhat similar to that provided by the conventional autocorrelation function. In particular, the crosslation sum function of a Gaussian process is proportional to the autocorrelation function of that process. Furthermore, the crosslation sum (CS) function of any time-reversible process is an even function of its argument, the relative delay $\tau$.

The difference $D_L(\tau)$ of the forward crosslation (FC) function $C^+_L(\tau)$ and the backward crosslation (BC) function $C^-_L(\tau)$, $$D_L(\tau)=C^+_L(\tau)-C^-_L(\tau)$$

is referred to as the crosslation difference (CD) function. A typical example is also shown in FIG. 10. The crosslation difference (CD) function $D_L(\tau)$ provides information related to that provided by the derivative of the conventional autocorrelation function. In particular, the crosslation difference (CD) function of a Gaussian process is proportional to the negated derivative of the autocorrelation function of that process. Also, the crosslation difference (CD) function of any time-reversible process is an odd function of its argument, the relative delay $\tau$.

Figure 11:
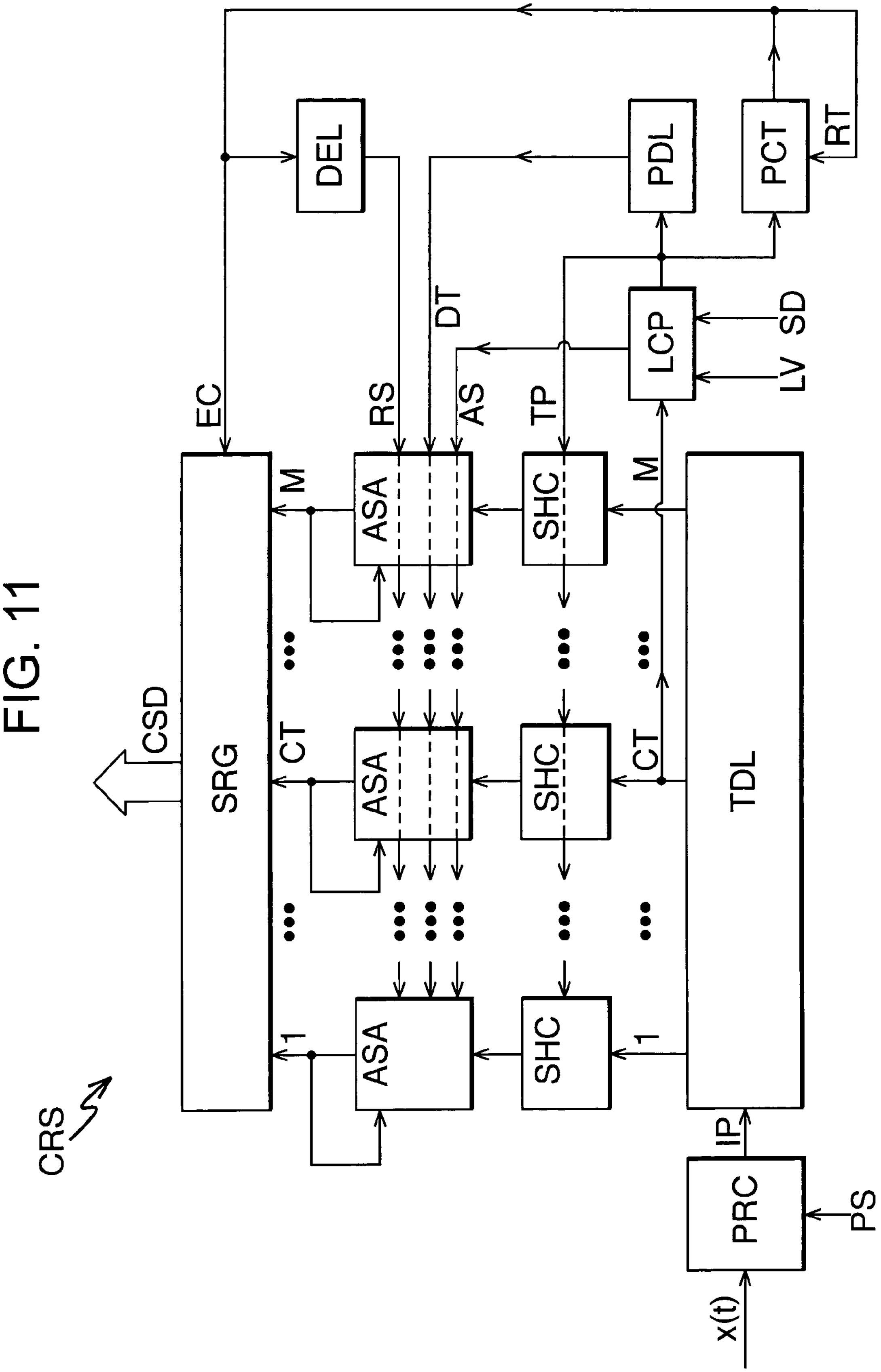
FIG. 11 is a block diagram of a modified version of the signal analysis device of FIG. 7.

The crosslation sum (CS) function and the crosslation difference (CD) function can be determined for a continuous-time signal x(t) with the use of a modified crosslator (CRS) shown in FIG. 11. The system comprises a polarity-reversal circuit (PRC), an analogue delay line with multiple taps (TDL), a level crossing processor (LCP), two pulse delay circuits (PDL and DEL), a pulse counter (PCT), a plurality of sample-and-hold circuits (SHC), a plurality of add/subtract accumulators (ASA) and a storage register (SRG). The storage register (SRG) may also incorporate a suitable waveform interpolator.

The operations performed by the modified crosslator differ from those performed by the basic crosslator (CRS) in FIG. 7 as follows.

The level crossing processor (LCP) produces a short trigger pulse (TP) each time a level crossing (upcrossing or downcrossing) is detected at the center tap (CT) of the delay line (TDL). The desired crossing level L is set by applying a suitable threshold value to the threshold input (LV) of the level crossing processor (LCP). The required operation mode, to determine the crosslation sum function or the crosslation difference function, is selected by applying a suitable value to a binary selector input (SD) of the level crossing processor (LCP).

Each add/subtract accumulator (ASA) adds or subtracts sample values supplied by a respective sample-and-hold circuit (SHC), depending on the command, ‘ADD’ or ‘SUBTRACT’, appearing at its control input (AS).

When the crosslation sum (CS) function is to be determined by the modified crosslator, the level crossing processor (LCP) sends command ‘ADD’, via the common control input (AS), to all the add/subtract accumulators (ASA), irrespective of the type of a detected level crossing (upcrossing or downcrossing). However, when the crosslation difference (CD) function is to be determined, the level crossing processor (LCP) sends command ‘ADD’ for each detected upcrossing, and command ‘SUBTRACT’ for each detected downcrossing. Because in a continuous-time signal upcrossings and downcrossings (of the same level) alternate, the operations ADD and SUBTRACT will also alternate following the crossings pattern.

In the modified crosslator system, the pulse counter (PCT) counts all level crossings, but its capacity is always set to an even number 2N to ensure that the number $N^+$ of processed upcrossings is exactly the same as the number $N^-$ of processed downcrossings; hence, $N^+=N^-=N$.

The crosslator (CRS) of FIG. 11 could be used in the monitor (MON) of FIG. 7 by, for example, generating only a crosslation sum for each quantization level, and using the time-shift comparator (TSC) to calculate the maximum delay value $|\tau|$ at which the crosslation sums exhibit a significant difference from the average value of input signal x(t).

Figure 12:
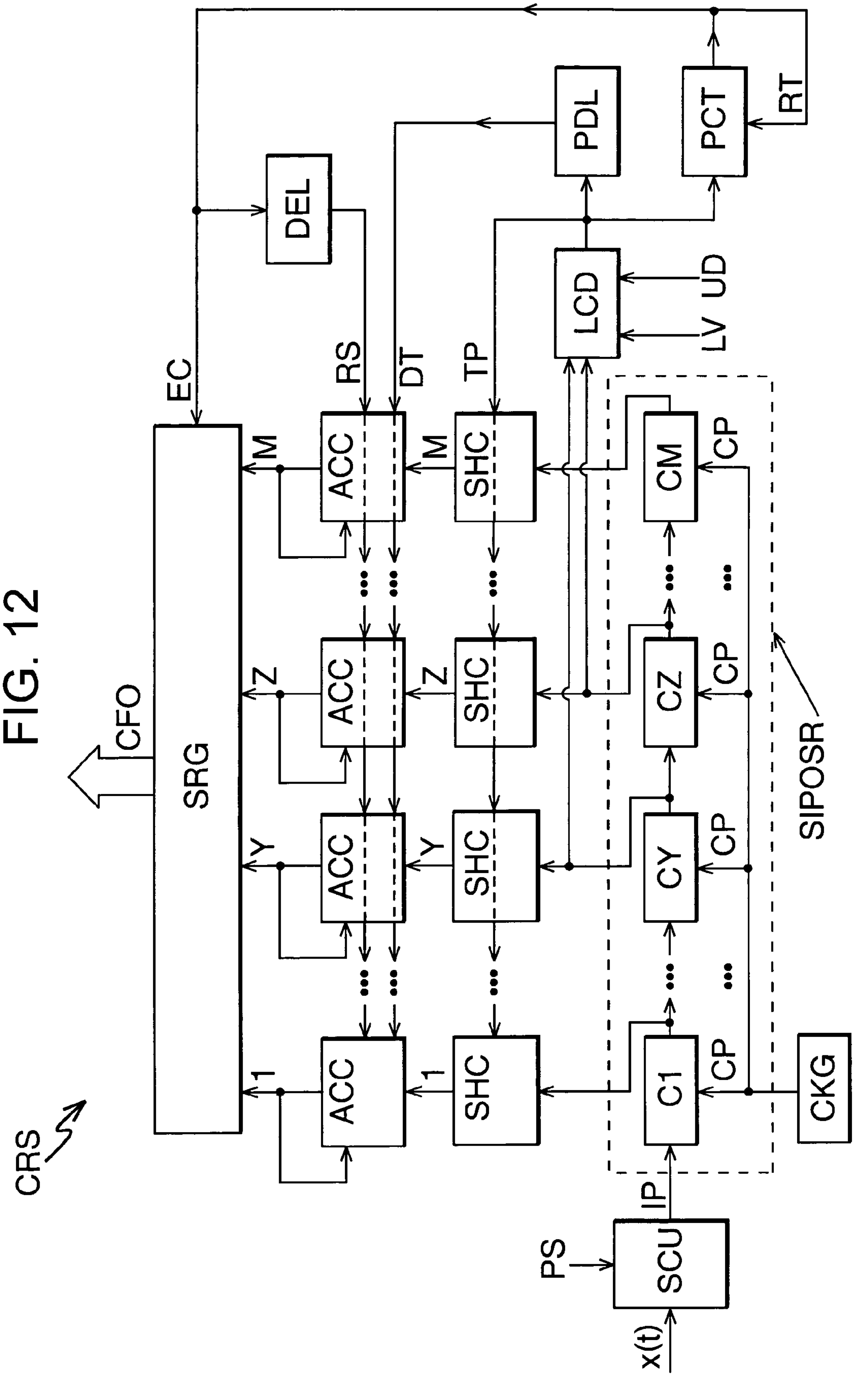
FIG. 12 shows a different modified version of the signal analysis device.

The analogue delay line (TDL) with multiple taps employed by the basic crosslator of FIG. 7 or the modified crosslator of FIG. 11 can be replaced by an analogue or digital serial-in-parallel-out (SIPO) shift register. FIG. 12 is a block diagram of the basic crosslator of FIG. 7 incorporating a SIPO shift register (SIPOSR). The system also comprises a signal conditioning unit (SCU), a clock generator (CKG), a level crossing detector (LCD), two pulse delay circuits (PDL and DEL), a pulse counter (PCT), a plurality of sample-and-hold circuits (SHC), a plurality of accumulators (ACC) and a storage register (SRG). The storage register (SRG) may also incorporate a suitable waveform interpolator.

An analogue continuous-time signal x(t) is converted by a signal conditioning unit (SCU) into a suitable (analogue or digital) form and then applied to the serial input (IP) of the SIPOSR.

The SIPO shift register consists of M storage cells, C1, C2, . . . , CM. Each cell has an input terminal, an output terminal and a clock terminal (CP). The cells are connected serially so that each cell, except for the first one (C1) and the last one (CM), has its input terminal connected to the output terminal of a preceding cell and its output terminal connected to the input terminal of a succeeding cell. The input terminal of cell C1 is used as the serial input (CP) of the SIPO shift register. The output terminals of all M cells are regarded as the parallel output terminals of the SIPO shift register. All clock terminals (CP) of the cells are connected together to form the clock terminal of the SIPO shift register.

A sequence of suitable clock pulses is provided by a clock generator (CKG). When at time instant to a clock pulse is applied to the clock terminal of the SIPO shift register, the signal sample stored in each cell is transferred (shifted) to and stored by the succeeding cell; cell C1 stores the value x(to) of the input signal x(t). The shift register can be implemented either as a digital device or as a discrete-time analogue device, for example, in the form of a "bucket-brigade" charge-coupled device (CCD).

The parallel outputs of the SIPO shift register are connected to respective M sample-and-hold circuits (SHC). Two selected adjacent SIPOSR outputs are also connected to two inputs of the level crossing detector (LCD). In the system shown in FIG. 12, the selected outputs are those of cell CY and cell CZ.

If the number M of the SIPOSR outputs is odd, then preferably one of the two selected outputs is the middle output, i.e. output (M+1)/2, of the SIPOSR. However, if the number of SIPOSR outputs is even, then the two selected outputs are preferably output M/2 and output M/2+1.

Because the SPO shift register is operating in discrete time, defined by clock pulses provided by the clock generator (CKG), the detection of crossing a predetermined level L by signal samples is slightly more complicated. However, the crossing detection can be accomplished by applying the following decision rule:

A. if output of $CY<L$ and output of $CZ>L$, then a level upcrossing has occurred in a "virtual" cell VC positioned between cell CY and cell CZ;

B. if output of $CY>L$ and output of $CZ<L$, then a level downcrossing has occurred in cell VC positioned between cell CY and cell CZ;

C. otherwise no level crossing has occurred in cell VC.

From statistical considerations it follows that when the period of the clock generator is small compared to the variability in time of a signal being processed, the 'time' location of the virtual cell VC is uniformly distributed over the clock period. Consequently, the virtual cell VC is 'located' in the middle between cell CY and cell CZ.

The crosslators (CRS) described above enable the generation of separate forward and backward crosslation functions (from which crosslation sum and crosslation difference functions can be derived), or the direct generation of crosslation sum and crosslation difference functions. Those functions can be generated for respective different crossing levels, which may be both positive and negative. In a particular convenient arrangement, the input signal x(t) has an average value AV of zero which enables simplification of the processing of the crosslation functions.

The choice of which crosslation function, or combination of functions, is to be used will dependent upon the application of the crosslator. It is envisaged that separate production of both forward and backward crosslation functions would be useful for determination of signal predictability. However other circumstances, such as signal classification, may warrant the use of crosslation sum and/or crosslation difference functions. In any event, the functions can be derived for a single crossing level or for multiple crossing levels. Generally speaking, for non-Gaussian signals, it is more informative to use one or more crossing levels which are significantly different from the mean AV of the signal x(t).

It is also possible to derive other types of crosslation functions. In the arrangements described above, each function corresponds to a respective crossing level. It would be possible to derive additional functions which relate to a combination of (for example the difference between) crosslation functions relating to respective different crossing levels. For example, the crosslation function (i.e. either forward or backward crosslation function) based on a crossing level of the mean value AV could be subtracted from the corresponding crosslation function for a positive level L. For Gaussian signals, the resulting function is a scaled replica of the autocorrelation function. By comparing the resultant with a separately-derived autocorrelation function it is possible to determine the extent to which the input signal characteristics depart from Gaussian characteristics. Furthermore, employing crosslation techniques for deriving an autocorrelation function for Gaussian signals is also regarded as independently useful.

In the arrangements described above, only the sign of the slope of the input signal x(t) was considered, rather than its magnitude. However, this is not essential; instead, the crosslator could be arranged to distinguish between slopes of different magnitude in each of the positive and negative directions; that is, the slope could be represented by two or more bits, rather than a single bit (representative of either positive or negative slope). In this situation, separate crosslation functions could be derived for each quantised slope level. Alternatively, the arrangement may be such that only certain quantised slope levels (e.g. the steepest slopes) are taken into consideration in deriving a crosslation function.

The input signal x(t) could represent any physical quantity of interest, such as noise, pressure, displacement, velocity, temperature, etc. Accordingly, the invention has wide fields of application, such as communications, radio astronomy, remote sensing, underwater acoustics, geophysics, speech analysis, biomedicine, etc. Although the specific examples given above refer to an input signal which varies with time, the argument of the function may represent any appropriate independent variable, such as relative time, distance, spatial location, angular position, etc.

If, as indicated above, the crosslator (CRS) is formed of a separate integrated circuit device, it is preferably provided with an input terminal for the input signal x(t), a threshold terminal for receiving a signal (LV) representing the crossing level and at least one output terminal for providing the output function (CSO) in either parallel or serial form.

A derived crosslation function may be used for classification purposes, whereby the derived crosslation waveform, for example the crosslation sum waveform, is used to indicate a specific class which best represents the object generating the signal. For this purpose, a suitable memory may be provided to store a set of representative templates' of crosslation waveforms (each template corresponding to a respective class and representing the shape of a crosslation function for that class). The classification may be carried out by finding the best match between a suitable representation of the determined crosslation function and the stored templates.

The shape of the crosslation waveform may be regarded as a 'fingerprint' signature used to discriminate between several (including 'unknown') classes of signal emitting objects.

The foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated.

The invention claimed is:

1. Apparatus for analysing statistical characteristics of an input signal, the apparatus comprising:

a signal input for receiving the signal;

an event detecting unit operatively coupled to the input for detecting events at which the signal level crosses a predetermined level with a predetermined slope;

a combining unit for combining multiple versions of the signal, the versions comprising overlapping parts of said signal and being shifted with respect to each other by amounts corresponding to the spacing of said events, to form a representation of the signal; and a measuring unit for measuring a parameter dependent upon the shape of said representation and indicative of a statistical characteristic of said signal.

2. Apparatus as claimed in claim 1, arranged such that signals are deemed to have a predetermined slope if the slope has a predetermined sign.

3. Apparatus as claimed in claim 1, the apparatus being arranged to form a first representation in response to detected events of a first predetermined slope, and a second representation in response to detected events of a second different predetermined slope.

4. Apparatus as claimed in claim 3, wherein the parameter is dependent upon the shape of the combined first and second representations.

5. Apparatus as claimed in claim 1, wherein the event detecting unit is operable to detect first and second different types of events, and the combining unit is operable to combine versions of the signal shifted by amounts corresponding to the first type of events, in a predetermined manner with versions of the signal shifted with respect to each other by amounts corresponding to the spacing of the second type of events to form said representation.

6. Apparatus as claimed in claim 5, including a mode switching unit operable to change said predetermined manner of combination.

7. Apparatus as claimed in claim 1, wherein said predetermined level is substantially different from the average level of the signal.

8. Apparatus as claimed in claim 1, including a crossing level input for receiving a signal defining said predetermined level.

9. An integrated circuit including an apparatus for analysing statistical characteristics of an input signal, the apparatus comprising:

a signal input for receiving the signal;

an event detecting unit operatively coupled to the input for detecting events at which the signal level crosses a predetermined level with a predetermined slope;

a combining unit for combining multiple versions of the signal, the versions being shifted with respect to each other by amounts corresponding to the spacing of said events, to form a representation of the signal; and a measuring unit for measuring a parameter dependent upon the shape of said representation and indicative of a statistical characteristic of said signal, wherein the integrated circuit further comprises:

a first input terminal for receiving said input signal, a second input terminal for receiving a threshold signal representing said predetermined level, and at least one output terminal for providing an output signal forming said representation.

10. A method of analysing an input signal, the method comprising detecting events at which the signal level crosses a predetermined level with a predetermined slope, forming a representation of a combination of multiple versions of the signal, the versions comprising overlapping parts of said signal and being shifted with respect to each other by amounts corresponding to the spacing of the events, and measuring a parameter dependent upon the shape of the representation.

11. A method according to claim 10, wherein the parameter is indicative of the degree of resemblance between said shape and the shape of a stored representation.

12. An apparatus for analysing statistical characteristics of an input signal, the apparatus comprising:

a signal input for receiving the signal;

an event detecting unit operatively coupled to the input for detecting events at which the signal level crosses a predetermined level with a predetermined slope;

a combining unit for combining multiple versions of the signal, the versions being shifted with respect to each other by amounts corresponding to the spacing of said events, to form a representation of the signal; and a measuring unit for measuring a parameter dependent upon the shape of said representation and indicative of a statistical characteristic of said signal, wherein the multiple versions of the signal are time-shifted copies of the input signal, wherein the event detecting unit is operable to detect first and second types of events, and the multiple versions of the signal include a first and second subset, such that each of the first subset of multiple versions of the signal is time-shifted according to a time instance when one of the first type of events occur, and each of the second subset of multiple versions of the signal is time-shifted according to a time instance when one of the second type of events occurs, and wherein the combining unit is operable to average together trajectories of the first subset of multiple versions of the signal to form a first crosslation function; and average together trajectories of the second subset of multiple versions of the signal to form a second crosslation function.

13. The apparatus as claimed in claim 12, wherein the first type of event corresponds to time instances when the input signal crosses a predetermined threshold with a positive slope, the second type of event corresponds time instances when the input signal crosses the predetermined threshold with a negative slope, and a time-reversibility of a process characterized by the input signal is determinable by comparing shapes of the first and second crosslation functions.

14. The method as claimed in claim 10, wherein the detecting events includes detecting first and second types of events, and the method further comprises generating a first subset of the multiple versions of the signal by time-shifting copies of the input signal according to time instances when the first type of events occurs;

generating a second subset of the multiple versions of the signal by time-shifting copies of the input signal according to time instances when the second type of events occurs.

15. The method as claimed in claim 14, wherein the forming a representation of a combination of multiple versions of the signals includes:

averaging together trajectories of the first subset of multiple versions of the signal to form a first crosslation function; and averaging together trajectories of the second subset of multiple versions of the signal to form a second crosslation function.

16. The method as claimed in claim 15, wherein the detecting step includes:

detecting the first type of event at time instances when the input signal crosses a predetermined threshold with a positive slope, detecting the second type of event at time instances when the input signal crosses the predetermined threshold with a negative slope.

17. The method as claimed in claim 16, wherein the measuring a parameter includes at least one of:

determining a time-reversibility of a process characterized by the input signal by comparing shapes of the first and second crosslation functions;

determining a minimum sampling interval according to a time interval at which there is a significant difference between at least one of the first and second crosslation functions and the average value of the input signal; and calculating at least one of a sum and difference of the first and second crosslation functions.

18. Apparatus for analysing statistical characteristics of an input signal, the apparatus comprising:

a signal input for receiving the signal;

an event detecting unit operatively coupled to the input for detecting both first events at which the signal level crosses a predetermined level with a positive slope and second events at which the signal level crosses said predetermined level with a negative slope;

a combining unit for combining multiple versions of the signal, the versions being shifted with respect to each other by amounts corresponding to the spacings between said first events and the spacings between said second events, to form at least one representation of the signal; and a measuring unit for measuring a parameter dependent upon the shape of said at least one representation and indicative of a statistical characteristic of said signal.

19. Apparatus according to claim 18, wherein said combining unit is operable to form a first representation based on multiple versions of said signal shifted with respect to each other by amounts corresponding to the spacing of said first events and a second representation based on multiple versions of said signal shifted with respect to each other by amounts corresponding to the spacing of said second events.

20. Apparatus according to claim 19, wherein said combining unit is operable to combine said first and second representations to obtain a combined representation, and wherein said measuring unit is arranged to measure a parameter dependent upon the shape of said combined representation.

21. A method of analysing an input signal, the method comprising:

detecting first events at which the signal level crosses a predetermined level with a positive slope and second events at which the signal level crosses said predetermined level with a negative slope;

forming at least one representation of the signal by combining multiple versions of the signal, the versions being shifted with respect to each other by amounts corresponding to the spacings between said first events and the spacings between said second events; and measuring a parameter dependent upon the shape of said at least one representation.

22. A method according to claim 21, wherein said step of forming comprises forming a first representation based on multiple versions of said signal shifted with respect to each other by amounts corresponding to the spacing of said first events and forming a second representation based on multiple versions of said signal shifted with respect to each other by amounts corresponding to the spacing of said second events.

23. A method according to claim 22, wherein said step of forming comprises forming a combined representation from said first and second representations, and said step of measuring comprises measuring a parameter dependent upon the shape of said combined representation.

* * * * *